(12) United States Patent
Ghosh et al.

(10) Patent No.: US 8,547,777 B2
(45) Date of Patent: Oct. 1, 2013

(54) NOR LOGIC WORD LINE SELECTION

(75) Inventors: Swaroop Ghosh, Hillsboro, OR (US); Dinesh Somasekhar, Portland, OR (US); Balaji Srinivasan, Hillsboro, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 299 days.

(21) Appl. No.: 12/928,989

(22) Filed: Dec. 22, 2010

(65) Prior Publication Data

US 2012/0163115 A1  Jun. 28, 2012

(51) Int. Cl.
   G11C 8/08  (2006.01)
   G11C 8/10  (2006.01)
   G11C 8/02  (2006.01)

(52) U.S. Cl.
   USPC ............. 365/230.06; 365/189.08; 365/230.02

(58) Field of Classification Search
   USPC .......................... 365/189.08, 230.02, 230.06
   See application file for complete search history.

(56) References Cited

U.S. PATENT DOCUMENTS

| | | | |
|---|---|---|---|
| 5,781,481 A * | 7/1998 | Iwakiri .................... | 365/230.06 |
| 5,889,416 A * | 3/1999 | Lovett ........................... | 326/121 |
| 6,111,795 A * | 8/2000 | Takita et al. .................. | 365/194 |
| 6,477,630 B2 * | 11/2002 | Ji et al. ............................ | 711/167 |
| 2002/0012284 A1 * | 1/2002 | Mochida .................... | 365/230.06 |
| 2002/0172070 A1 * | 11/2002 | Arimoto et al. ............... | 365/149 |
| 2005/0013166 A1 * | 1/2005 | Chen et al. ............... | 365/185.03 |
| 2007/0121410 A1 * | 5/2007 | Mori ............................. | 365/222 |
| 2007/0153584 A1 | 7/2007 | Mohammad et al. | |
| 2009/0086563 A1 | 4/2009 | Morein | |
| 2009/0296497 A1 * | 12/2009 | Hirabayashi ............. | 365/189.09 |

FOREIGN PATENT DOCUMENTS

KR   1020080020347   3/2008

OTHER PUBLICATIONS

Notice of Allowance mailed May 23, 2012 for Chinese Patent Application No. 2011 20536679.8.
International Search Report and Written Opinion mailed Jun. 26, 2012 for International Patent Application No. PCT/US2011/061607.

* cited by examiner

*Primary Examiner* — J. H. Hur
(74) *Attorney, Agent, or Firm* — Blakely, Sokoloff, Taylor & Zafman LLP

(57) ABSTRACT

A NOR architecture for selecting a word line driver in a DRAM is disclosed. Complements of separately decoded addresses in the low, mid and high ranges are used to select a final word line driver. The output of the word line driver is at a potential negative with respect to ground for a deselected word line and a positive potential more positive than the power supply potential for a selected word line.

20 Claims, 8 Drawing Sheets

NOR LOGIC WORD LINE SELECTION

FIELD OF THE INVENTION

The invention relates to the field of dynamic random access memories (DRAMs) and in particular to word line drivers in these memories.

BACKGROUND OF THE INVENTION

It has been recognized for many years that boosting potentials during active DRAM cycles can enhance reading and writing. See, U.S. Pat. Nos. 4,247,917; 4,087,704; and 4,584,672.

It is also known in DRAMs to level shift signals for a variety of reasons. An example of level shifting is shown in U.S. Pat. No. 4,460,257.

DETAILED DESCRIPTION

A word line (WL) driver and WL selection circuits for a dynamic random access memory (DRAM) is disclosed. In the following description, numerous specific details are set forth such as specific numbers of word lines and word line drivers, in order to provide a thorough understanding of the present invention. It will be obvious to one skilled in the art, that the present invention may be practiced without these specific details. In other instances, well-known circuits are not described in detail to avoid unnecessarily obscuring the present invention.

The DRAM described below is fabricated using complementary metal-oxide (CMOS) technology as a single integrated circuit using known processing technology.

Word Line Driver Signal

The described DRAM in one embodiment operates from a single potential of Vcc (e.g. 1 volt) referenced to ground (Vss). As will be seen, the driving signals on the WLs extend from a positive potential higher than Vcc (e.g. 1.5 volts) to a negative potential (e.g. 0.25 volts) with respect to Vss. There are on-chip charge pump circuits used to generate both the higher positive potential and the lower negative potential. Thus only a single potential is applied to the memory and the substrate on which the circuit is fabricated remains at Vss.

Figures 1A, 1B:
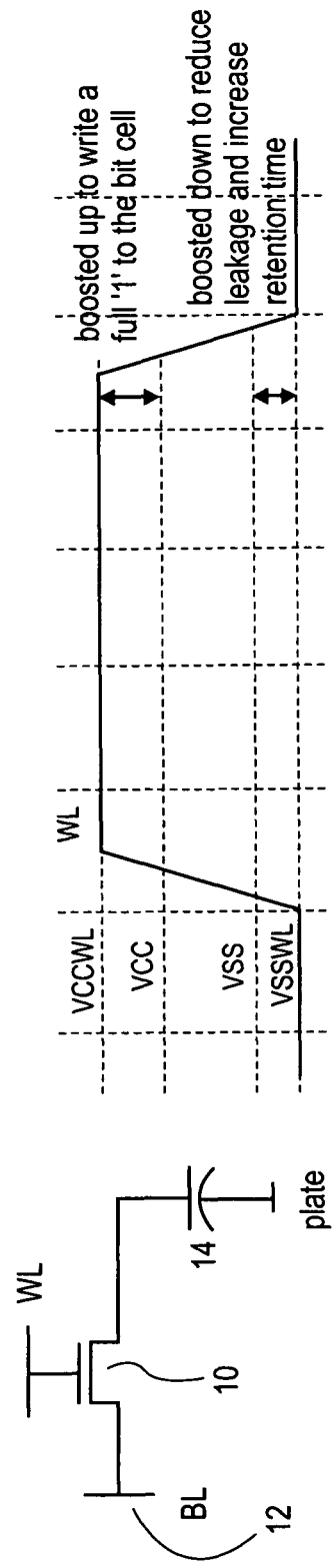
FIG. 1A is a schematic of a single cell in a DRAM.
FIG. 1B is a waveform for a word line driver signal. As will be seen, this signal rises above Vcc and drops below Vss.

Referring to FIG. 1A, a single DRAM cell is shown having a capacitor 14 with one of its terminals coupled to ground and the other coupled to the n-channel transistor 10. Transistor 10 selectively couples the capacitor 14 to a bit line 12. The waveform of the WL signal is shown in FIG. 1B. It extends from a negative potential (VssWL) with respect to Vss to a positive potential greater than Vcc (VccWL). VssWL reduces leakage through the transistor 10 and consequently increases the retention time of charge on the capacitor 14. The more positive VccWL potential assures that there will be no threshold drop across transistor 10 and thus during writing, capacitor 14 can be charged to a full Vcc potential. Without protecting circuits, switching and transferring the higher positive voltage with ordinary transistors used in CMOS circuits increases leakage as well as defect rates. As will be seen, higher voltage protection is included in the circuits described below.

Figure 2:
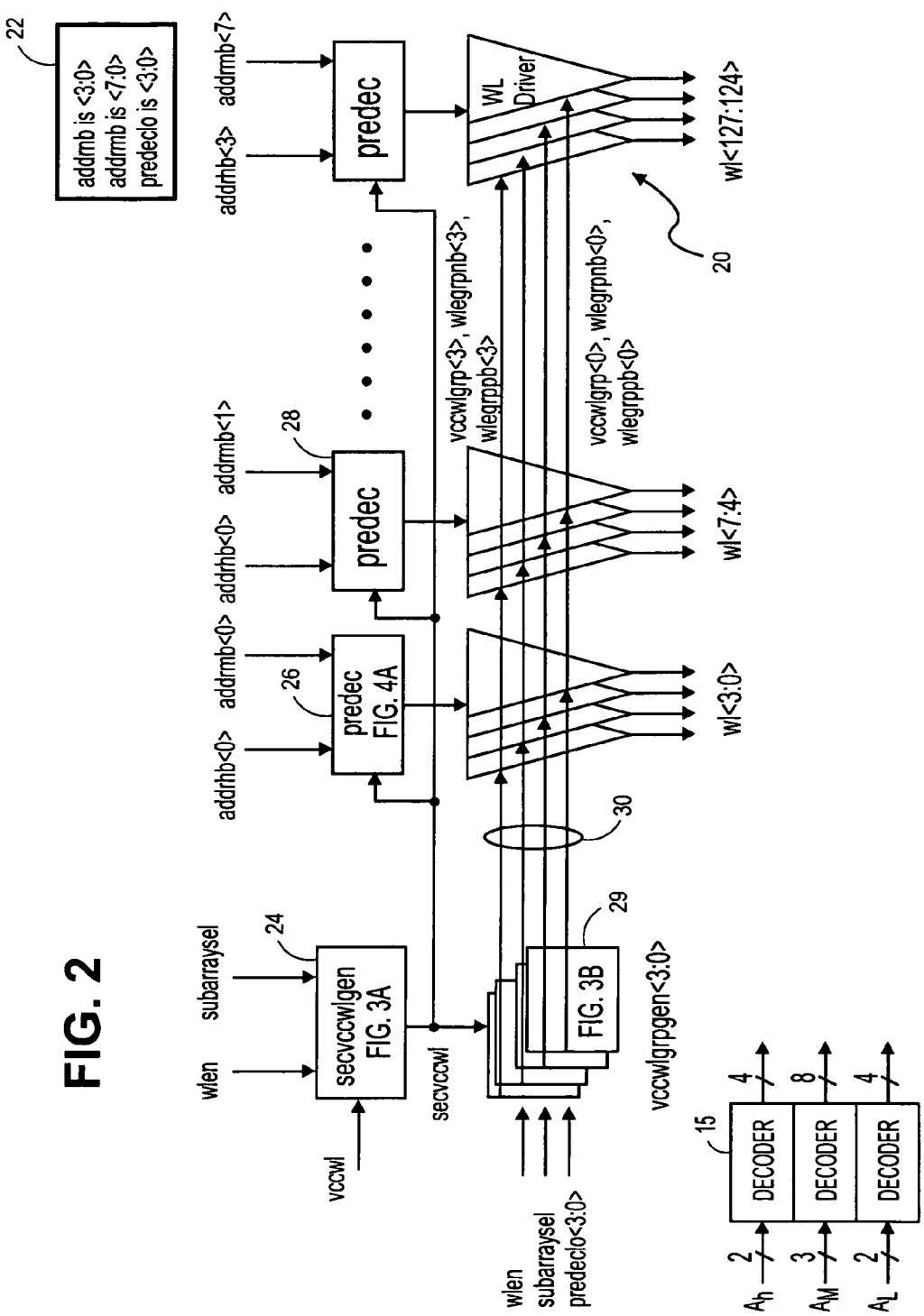
FIG. 2 is a diagram illustrating the grouping of word line drivers and the decoders used for selecting the word line drivers.

Architecture of FIG. 2

In the described embodiment, there are 128 WLs with the WL drivers organized in groups of four drivers, as shown in FIG. 2. Group 20, for instance, provides driver signals for WLs 124-127. The output of each of the drivers provides the waveform shown in FIG. 1B.

In the architecture of FIG. 2, the WLs are selected by seven of the address bits applied to the memory. These seven address bits are separated into two higher range address bits, three mid range address bits, and two low range address bits. These undecoded address bits are shown coupled to three decoders 15 in FIG. 2. The complement of the two high range address bits, after decoding, yield four decoded address bits shown in block 22 as a addrhb <3:0>, the complements of the mid range address bits, after decoding, are shown in block 22 as addrmb<7:0>, and finally, the decoded lower range address bits are shown in block 22 as predeclo<3:0>. Thus to summarize, there are four decoded higher range address signals, eight mid-range decoded address signals and four lower level decoded address signals. These signals allow the selection of one of the 128 WLs (4×8×4=128). FIG. 2 illustrates WLs in a subarray of the memory. The entire DRAM has a plurality of subarrays forming banks and a plurality of banks.

Figure 3A:
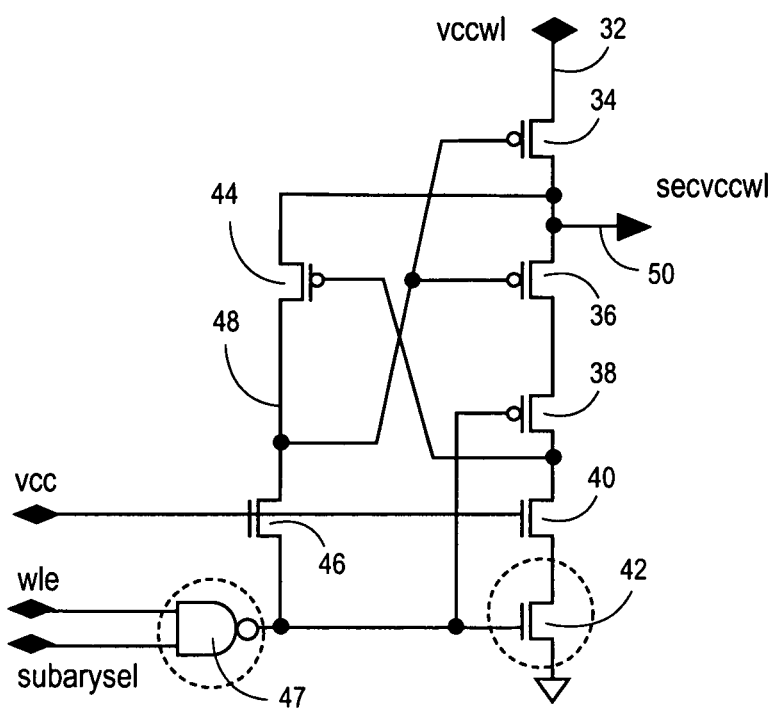
FIG. 3A is an electrical schematic of a sector level selection circuit.
Figure 3B:
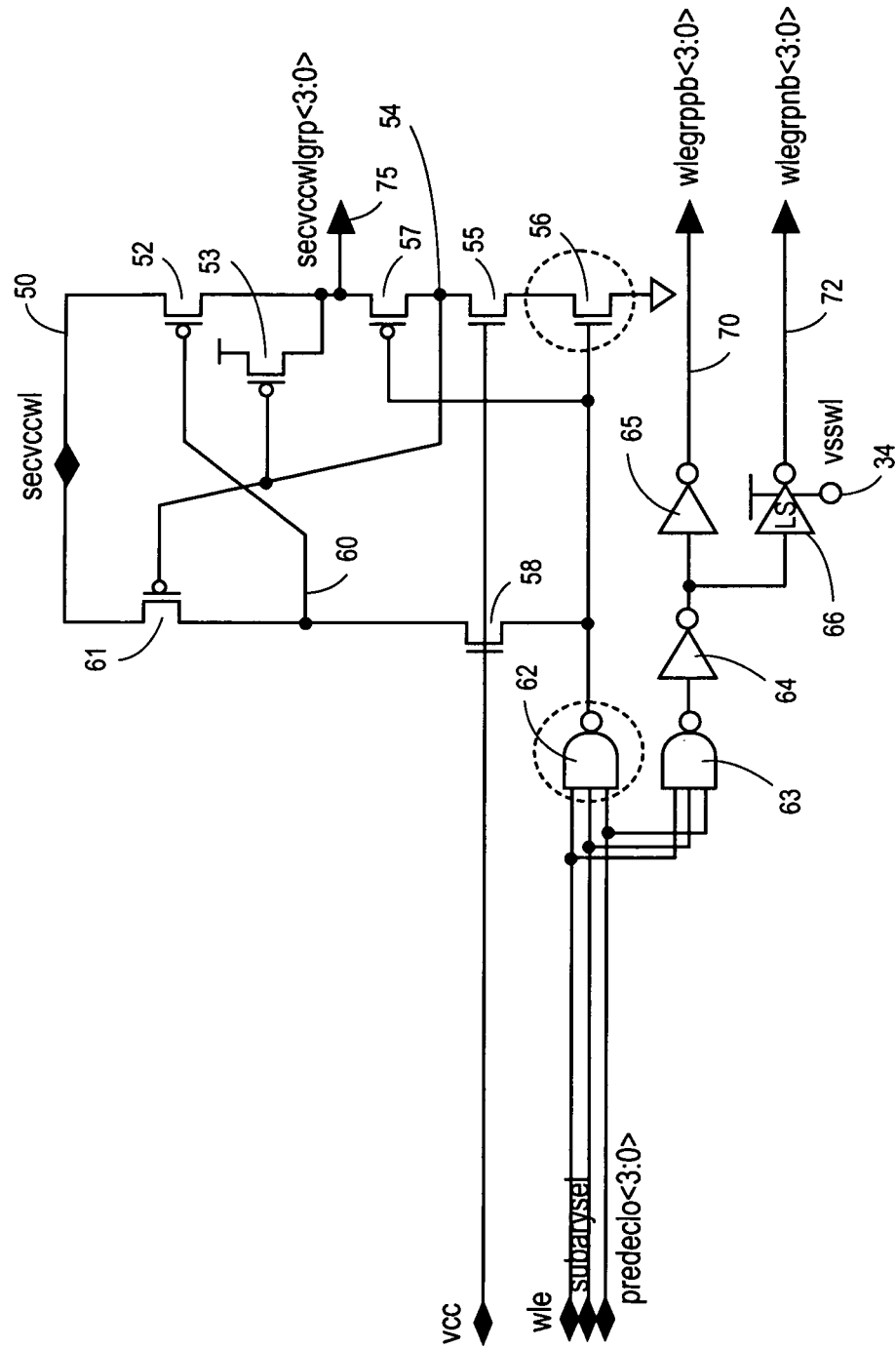
FIG. 3B is an electrical schematic for one of the selection circuits which employ the lower range of decoded address signals.

There is a first level of selection that occurs with the architecture of FIG. 2 where circuit 24 (shown in detail in FIG. 3A) activates (wakes up) the four selection circuits 29 (shown in detail in FIG. 3B). Moreover, the output of circuit 24 partially wakes up the predecoder such as predecoders 26 and 28 and WL drivers. Circuit 24 reduces the load on the positive charge pump since only a part of the memory is activated at one time. In particular circuit 24 activates predecoders, selection circuits and WL drivers associated with the subarray signal for circuit 24. As will be seen when FIG. 3A is discussed, the circuit 24 receives the subarray select signal, a WL enable signal, and the potential more positive than Vcc (VccWL).

Each of the predecoders, such as decoders 26 and 28, receive one of the complements of the decoded address bits from the high and mid range addresses. For the illustrated embodiment, 32 combinations of these decoded address bits exist and thus there are 32 predecoders, each of which selects a group of four WL drivers. For example, the predecoder 26 selects the WL drivers for WLs 0-3 and the predecoder 28 preselects the WL drivers for WLs 4-7. Decoder 24 receives the decoded address signals addrhb<0> and addrmb<0> and predecoder 28 receives the decoded address signals addrhb<0> and addrmb<1>.

The selection of a single WL driver from the group selected by one of the predecoders occurs by the signals on lines 30. Each of the circuits 29 provides three selection signals which are coupled to each of the WL drivers. As will be seen in more detail in conjunction with FIG. 3B, two of these signals are based on the decoded lower address bits and selects a single one of the WL drivers from the group of WL drivers selected by one of the predecoders. The other signal from the circuit 29 (vccwlgrp) activates or wakes up 32 WL drivers, one of which provides the WL driving signal.

Selection Circuit of FIG. 3A

The circuit of FIG. 3A receives the VccWL potential on line 32 and selectively provides this signal as its output on line 50 (secvccwl). When both the WL enable signal and subarray select signal are high, the output of the NAND gate 47 is low. Node 48 is coupled to the output of NAND gate 47 through the transistor 46 which is always on since its gate is coupled to Vcc. The gates of the p-channel transistors 34 and 36 are coupled to the node 48 and thus both of these transistors are on when the output of the NAND gate 47 is low. Moreover, when node 48 is low, the p-channel transistor 38 conducts. The drain of this transistor is connected to the gate of the p-channel transistor 44 and therefore when the output of the NAND gate 47 is low, transistor 44 does not conduct. At this time, n-channel transistor 42 is not conducting. It should be noted that the secvccwl signal is pulled to VccWL when the circuit of FIG. 3A is selected, and as will be seen the potential on line 50 is used by the predecoders as well as the selection circuits 29.

When the subarray is not selected or when wel is not selected, the output of the NAND gate 47 is high and node 48 is also high. When this occurs, transistors 34 and 36 are off, as is transistor 38. Now, transistor 42 conducts and since transistor 40 is always on, the gate of transistor 44 drops to ground. The path through transistors 44 and 46 drops the potential on line 50 below VccWL. Here transistor 44 connects together the drain and gate of transistor 34 effectively providing a diode that lowers the secvccwl signal.

The transistors 40 and 46 provide protection from the higher voltage VccWL, for transistor 42 and the gate 47, respectively. When the circuit of FIG. 3A is selected, transistor 42 is off, and the higher potential of VccWL would be on the transistor's drain but for transistor 40. At this time, transistor 40 is on since its gate is coupled to Vcc. It provides a threshold voltage drop so that transistor 42 is not subjected to the VccWL potential. Similarly, when the circuit of FIG. 3A is deselected, the output of gate 47 would be exposed to the higher potential of VccWL but for transistor 46. The threshold voltage drop across transistor 46 consequently reduces the stress on the gate 47.

Selection Circuit of FIG. 3B

There are four circuits such as the one shown in FIG. 3B used in the architecture of FIG. 2. Each one receives one of the decoded lower range address bits and provides three outputs on line 70, 72 and 75. The output on line 75, when the circuit is selected, is the higher potential VccWL. Specifically, secvccwl from line 50 is coupled to the output line 75 through the p-channel transistor 52 when the circuit is selected. When the circuit is deselected, the p-channel transistor 53 conducts clamping the line 75 to Vcc. The latch-like arrangement of transistors 52, 57 and 61 provides that transistor 61 is off when transistors 52 and 57 conduct, and likewise when transistors 52 and 57 are off, transistor 61 conducts. The conduction of transistor 61 shorts the gate and source of transistor 52, therefore transistor 52 is off. The n-channel transistors 55 and 58 have their gates coupled to Vcc and provide protection in the same manner as discussed in conjunction with FIG. 3A for the transistor 56 and NAND gate 62, respectively. Again, as previously discussed, without the transistors 55 and 58 these devices would be exposed to the higher potential.

The circuit of FIG. 3B is selected by the WL enable signal and the subarray select signal, both of which are coupled to the NAND gates 62 and 63. There are four circuits of FIG. 3B for the architecture of FIG. 2, each receive one of the four decoded lower range address signals. When the conditions of gate 62 are met, its output is low and node 60 is low. This is when transistors 52 and 57 conduct providing the high output signal on line 75. At this time, node 54 is low and consequently, transistor 61 is off. Here, transistor 53 is off, because its drain and gate are at the potential higher than Vcc and its source is at Vcc.

When the circuit of FIG. 3B is deselected, the conditions of gate 62 are not met, and the output of this gate is high, accordingly, transistor 56 conducts and transistor 57 is off. This allows transistor 53 to maintain line 75 at Vcc. Node 54 is drawn to ground potential through transistors 55 and 56 and transistor 61 conducts. Node 60 is high, turning off transistor 52.

The lower part of the circuit of FIG. 3B provides two output signals, the signals are logically the same. Both signals when selected are coupled to Vcc. When deselected, line 70 is coupled to Vss whereas, because of level shifter 66, line 72 is coupled to VssWL (line 34). The conditions needed to satisfy gate 63 are the same as those for gate 62. The output of gate 63 is first coupled through an inverter 64 and then to the input of the inverters 65 and 66. The output of line 70 is simply inverted through inverter 65, whereas the signal on line 72 is shifted with the level shifter of FIG. 3C. The signals on line 70 and 72 are coupled to the WL drivers such as the WL driver of FIG. 3B through the lines 30 of FIG. 2. The signal on line 75 for each of the four circuits of FIG. 3B is coupled to 32 WL drivers.

Figure 3C:
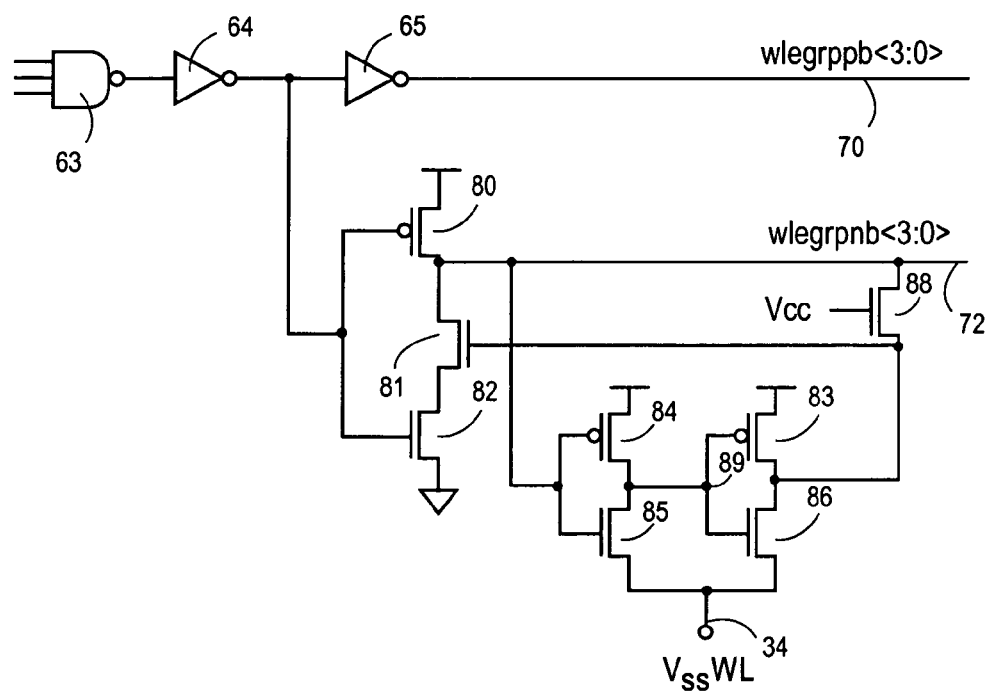
FIG. 3C is an electrical schematic for a level shifter shown in FIG. 3B.

The Level Shifter of FIG. 3C

The inverting level shifter 66 of FIG. 3B is shown in detail in FIG. 3C. Again, the NAND gate 63 and inverters 64 and 65, which provide the signal on line 70, are shown. The output of the inverter 64 is coupled to the gates of the transistors 80 and 82. Transistor 81 is coupled between these transistors with its gate coupled to line 72 through the transistor 88. The transistor 88 has its gate coupled to Vcc. A pair of inverters comprising transistors 83 and 84, and transistors 85 and 86 are coupled between Vcc and the negative potential VssWL.

When the circuit of FIG. 3C is selected, the conditions of gate 63 are met and the signal on line 72 will be low, the output of inverter 64 is high and as a result transistor 80 is off and transistor 82 conducts. Since transistor 81 is conducting, the gates of transistors 84 and 85 are pulled low and node 89 rises in potential. This turns off transistor 83 and causes transistor 86 to conduct. Line 72 is pulled to VssWL through transistors 88 and 86.

Note, the circuit of FIG. 3C is a two level connector. Line 72 is pulled near ground by transistors 81 and 82. Then it is pulled lower by transistors 85 and 86. This reduces the load on the VssWL charge pump.

When the circuit of FIG. 3C is deselected, the gates of transistors 80 and 82 will be low and transistor 80 will conduct, pulling the output line 72 to Vcc. Transistor 85 will also conduct and thus node 89 will be low and transistor 86 is off, preventing the output line from being pulled low.

Figure 4A:
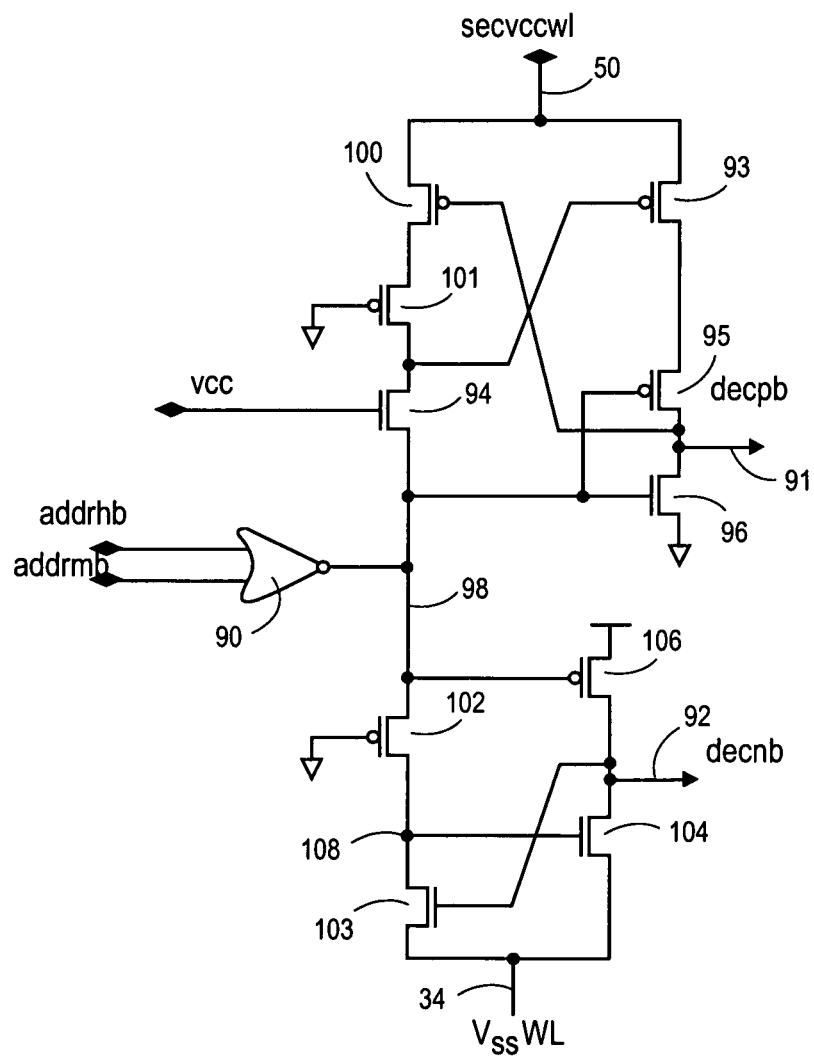
FIG. 4A is an electrical schematic for a predecoding circuit and two associated level shifters.

Predecoder of FIG. 4A

There is one predecoder of FIG. 4A for every four WLs for the architecture of FIG. 2. Each of the predecoders receives the complement of the decoded address bits from the high range (addrhb) and the complement of the decoded signal from the mid range (addrmb). The conditions of the NOR gate 90 are met when both inputs are low, then a positive signal at node 98 is present. For this condition the circuit of FIG. 4A is selected. For all other inputs to gate 90, node 98 is low and the circuit is deselected. There are two level shifters shown in FIG. 4A, one provides the decpb signal on line 91 and the other the decnb signal on line 92. The signal on line 91, when the circuit of FIG. 4A is deselected, rises to secvccwl (line 50). At this time, the decnb signal is at Vcc. When the circuit is selected, the signal on line 91 is at Vss, and in contrast the signal on line 92 is at VssWL.

When the circuit of FIG. 4A is selected, node 98 is high and thus transistor 93 and 95 cease conducting while transistor 96 conducts. This brings line 91 to ground. Under these conditions, transistor 100 conducts, reinforcing the off state of transistor 93. In the lower shift register, the high signal on line 98 results in transistor 106 not conducting while transistor 104 conducts, pulling line 92 to VssWL. Transistor 103 also ceases conducting, reinforcing the on-state of transistor 104.

When node 98 is low, transistor 93 and 95 conduct. This brings line 91 to the potential on line 50 (deselected). Transistors 96 and 100 are not conducting. In the lower level shifter, node 108 is low when the circuit is deselected, thus transistor 104 is off. On the other hand, transistor 106 conducts, raising line 92 to Vcc. This potential on line 92 causes transistor 103 to conduct, reinforcing the off state of transistor 104.

As was the case in the earlier circuits, the transistor 94 provides protection for the gate 90 and prevents it from being exposed to the higher positive potential. Transistor 102 prevents a negative potential from reaching node 98. This protects transistor 94 and the n-channel transistor in gate 90. Similarly, transistor 101 protects the drain-source regions of transistor 100 from the negative potential.

Figure 4B:
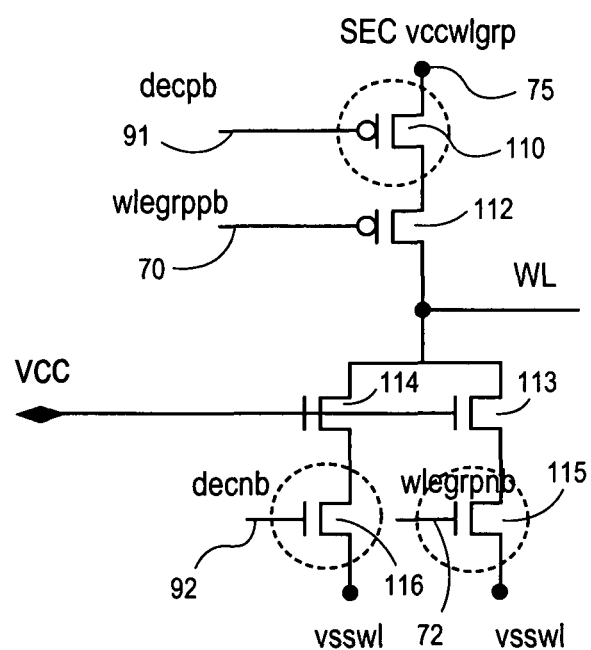
FIG. 4B is an electrical schematic of a word line driver.

Word Line Driver of FIG. 4B

The word line driver (a NOR logic device) includes series p-channel transistors 110 and 112 which provide a path when conducting between line 75 and WL, and thereby bring WL to VccWL. WL is brought to VssWL through the parallel paths of transistors 115 and 116. When the WL is selected, decpb (line 91), wlegrppb (line 70), decnb (line 92), and wlegrpnb (line 72) are in their low state of Vss or VssWL. Under these conditions, WL is brought to VccWL from line 75, selecting those cells coupled to the WL. At this time, the transistors 115 and 116 do not conduct. On the other hand when the circuit is deselected, transistors 110 and 112 do not conduct, and transistors 115 and 116 conduct, bringing the WL to VssWL. The condition of the WL and of the source, drain and gates of transistors 110, 112, 115 and 116 are set forth in a table below.

Transistor 112 protects transistor 110 from having the VccWL potential across its source and drain. And as previously described, transistors 113 and 114 provide protection for transistors 115 and 116, respectively from the high potential appearing across their source and drains.

Figure 5:
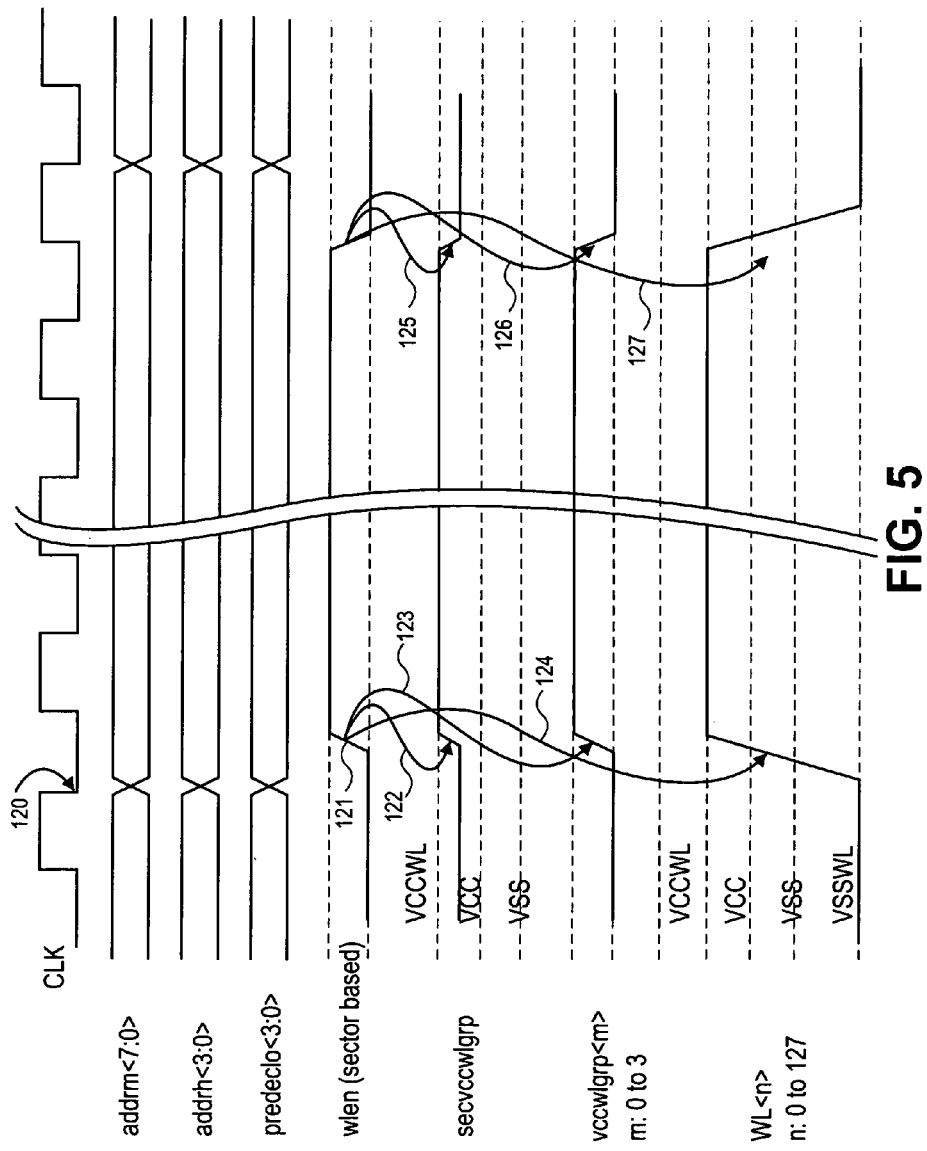
FIG. 5 is a timing diagram used to describe the operation of the circuits of FIGS. 3A-4B.

Timing Diagram of FIG. 5

The top waveform in FIG. 5 is a memory clock from which all the other timing signals are triggered. At time 120 the transitions in the three decoded address signal for the high, mid and lower range of addresses, indicates that addresses for selecting a WL from the decoder 15 of FIG. 2 are present. Shortly thereafter at time 121, this sector-based wlen signal becomes active and as indicated by arrow 122, the secvccwlgrp signal rises from its inactive state (a threshold voltage below VccWL) to VccWL. At this time, as indicated by arrow 123, the vccwlgrp signal becomes active, this is the output of the circuit 29 of FIG. 3. The WL drivers perform the final decoding, and one of them provides the WL driving signal as indicated by arrow 124. Note the signal rises from VssWL to VccWL. After the completion of a read or write cycle, the WL enable signal drops in potential and then as indicated by arrow 15, the sector group potential (secvccwlgrp) drops as indicated by arrow 126. Finally, the WL driving signal, as indicated by arrow 17, returns to its deselected position, the negative potential VssWL.

Thus, a word line selection architecture has been described which uses NOR logic and which provides a WL driver signal having a high potential higher than Vcc and a lower potential negative with respect to Vss.

What is claimed is:
1. A DRAM, comprising:
a plurality of decoders each for selecting a group of word line drivers from a plurality of groups of word line drivers, the plurality of decoders receiving decoded address signals in a first range of memory addresses and a second range of memory addresses and providing first and second selection signals; and
a plurality of first selection circuits for receiving decoded address signals in a third different range of memory addresses, the plurality of first selection circuits each providing a plurality of third and fourth selection signals, coupled to the word line drivers of the groups of word line drivers, such that a single word line driver is selected for each unique decoded address in the first, second and third ranges of memory addresses,
wherein the third and fourth selection signals are in a low state to select the single word line driver.
2. The DRAM of claim 1, wherein the plurality of decoders employ NOR logic, and wherein the first and second selection signals are in a low state when the group of word line drivers is selected.

| | Transistor 110 | | | Transistor 112 | | | Transistor 115 | | | Transistor 116 | | |
|---|---|---|---|---|---|---|---|---|---|---|---|---|
| WL condition | S | G | D | S | G | D | S | G | D | S | G | D |
| Idle | VCC | VCCWL | VCC/2 | VCC/2 | VCC | VSSWL | VSSWL | VCC | VSSWL | VSSWL | VCC | VSSWL |
| Selected WL | VCCWL | VSS | VCCWL | VCCWL | VSS | VCCWL | VSSWL | VSSWL | VCC | VSSWL | VSSWL | VCC |
| Selected WL grp/ unselected WL | VCCWL | VCCWL | VCC/2 | VCC/2 | VSS | VSSWL | VSSWL | VSSWL | VSSWL | VSSWL | VCC | VSSWL |

3. The DRAM of claim 1, wherein the word line drivers employ NOR logic for the selection of the single word line driver.

4. The DRAM of claim 1, wherein the decoded address signals in the first and second ranges of memory addresses are complementary signals.

5. The DRAM of claim 1, wherein the DRAM operates from a single positive power supply of Vcc with respect to ground (Vss), and wherein deselected word line drivers provide an output signal negative with respect to Vss.

6. The DRAM of claim 5, wherein the selected word line driver provides an output signal more positive than Vcc.

7. The DRAM of claim 6, wherein the plurality of decoders, the group of word line drivers and the plurality of first selection circuits form a sector in a memory, and including a second selection circuit for providing a sector selection signal to the plurality of first selection circuits.

8. The DRAM of claim 7, wherein the sector selection signal is also coupled to the plurality of decoders.

9. The DRAM of claim 8, wherein the sector selection signal, when active, is more positive than Vcc.

10. The DRAM of claim 9, wherein the plurality of first selection circuits provide a fifth selection signal for each of the decoded address signals in the third range of memory addresses, wherein the fifth selection signal being more positive than Vcc, and wherein the fifth selection signal being provided to the word line drivers, including the single word line driver.

11. The DRAM of claim 6, wherein the plurality of first selection circuits include first transistors for protecting second transistors from exposure to the potential more positive than Vcc.

12. The DRAM of claim 6, wherein the word line drivers include first transistors for protecting second transistors from exposure to the potential more positive than Vcc.

13. A DRAM comprising:
a plurality of word line drivers;
a plurality of decoders each using a NOR logic device for providing a first selection signal and a second selection signal which selects a group of the word line drivers, each NOR logic device for receiving a complement of a first decoded address signal derived from a first range of memory addresses and a complement of a second decoded address signal derived from a second range of memory addresses, different from the first range of memory addresses; and
each of the word line drivers, of the plurality of word line drivers, using NOR logic such that a single word line driver is selected, each of the word line drivers receiving one of the first and second selection signals from the plurality of decoders, and each of the word line drivers receiving third and fourth selection signals derived from decoded address signals in a third range of memory addresses, different than the first and second ranges of memory addresses,
wherein the third and fourth selection signals are in a low state to select the single word line driver.

14. The DRAM of claim 13, wherein the DRAM operates from a single positive potential Vcc with respect to ground (Vss), and wherein a selected word line driver provides an output signal more positive than Vcc.

15. The DRAM of claim 14, wherein the deselected word line drivers provide a negative signal with respect to Vss.

16. The DRAM of claim 15, wherein the first selection signal is more positive than Vcc in its deselected state, and wherein the second selection signal is negative in its selected state.

17. The DRAM of claim 16, wherein the third selection signal is negative in its selected state.

18. A method for operating a DRAM from an applied positive potential Vcc with respect to ground (Vss), comprising:
logically combining complements of decoded high level and mid level address signals to provide first and second selection signals, the first selection signal being referenced to a negative potential in its select state and the second selection signal being more positive than Vcc in its deselected state;
selecting a group of word line drivers with the first and second selection signals;
generating third and fourth selection signals based on low level address signals, the third selection signal being referenced to a negative potential in its select state; and
selecting one word line driver from the group of word line drivers with the third and fourth selection signals.

19. The method defined by claim 18, wherein the logically combining step uses NOR logic.

20. The method defined by claim 19, wherein the selecting of one word line driver uses NOR logic.

* * * * *